US009410238B2

(12) United States Patent
Goela et al.

(10) Patent No.: US 9,410,238 B2
(45) Date of Patent: Aug. 9, 2016

(54) METHOD OF MAKING DURABLE ARTICLES

(75) Inventors: Jitendra S. Goela, Andover, MA (US); Heather A. G. Stern, Chelmsford, MA (US)

(73) Assignee: Rohm and Haas Electronic Materials LLC

(*) Notice: Subject to any disclaimer, the term of this patent is extended or adjusted under 35 U.S.C. 154(b) by 1396 days.

(21) Appl. No.: 12/886,271

(22) Filed: Sep. 20, 2010

(65) Prior Publication Data

US 2013/0230707 A1    Sep. 5, 2013

Related U.S. Application Data

(60) Provisional application No. 61/276,983, filed on Sep. 18, 2009.

(51) Int. Cl.
| C23C 14/34 | (2006.01) |
| C23C 14/54 | (2006.01) |
| C23C 14/50 | (2006.01) |
| C23C 14/08 | (2006.01) |
| C23C 14/35 | (2006.01) |
| G02B 1/10  | (2015.01) |

(52) U.S. Cl.
CPC ........... C23C 14/34 (2013.01); C23C 14/081 (2013.01); C23C 14/3485 (2013.01); C23C 14/357 (2013.01); C23C 14/505 (2013.01); C23C 14/542 (2013.01); G02B 1/105 (2013.01); *Y10T 428/24967* (2015.01); *Y10T 428/26* (2015.01); *Y10T 428/263* (2015.01)

(58) Field of Classification Search
CPC .. C23C 14/357; C23C 14/505; C23C 14/542; C23C 14/3485; C23C 14/081
USPC .............. 204/192.12, 192.15, 192.16, 192.26
See application file for complete search history.

(56) References Cited

U.S. PATENT DOCUMENTS

| 4,602,847 | A | * | 7/1986 | Born et al. .................. 427/255.7 |
| 4,685,110 | A |   | 8/1987 | DeBell et al. |
| 4,721,553 | A | * | 1/1988 | Saito ................... H01J 37/3405 204/192.1 |
| 4,809,293 | A |   | 2/1989 | DeBell et al. |
| 4,851,095 | A | * | 7/1989 | Scobey .................... C23C 8/02 204/192.12 |
| 4,907,846 | A |   | 3/1990 | Tustison et al. |
| 4,995,684 | A |   | 2/1991 | Tustison et al. |
| 5,067,781 | A |   | 11/1991 | Montanari et al. |
| 5,194,985 | A |   | 3/1993 | Hilton |
| 5,268,217 | A | * | 12/1993 | Kimock et al. ............... 428/216 |
| 5,667,650 | A | * | 9/1997 | Face .................... C23C 14/0063 204/192.24 |
| 2006/0051602 | A1 | * | 3/2006 | Iacovangelo et al. ......... 428/472 |
| 2006/0286382 | A1 |   | 12/2006 | Anzures et al. |
| 2008/0210555 | A1 |   | 9/2008 | Yang et al. |

FOREIGN PATENT DOCUMENTS

| EP | 0 842 046 B1 | 6/2005 |
| WO | 95/13189 A1 | 5/1995 |
| WO | WO 97/13169 | 4/1997 |

OTHER PUBLICATIONS

European Search Report of Corresponding European Application No. 10 17 7465.
Li-Jiang Meng, "Annealing effect of ITO thin films prepared by microwave-enhanced dc reactive magnetron sputtering for telecommunication applications", Surface and Coatings Technology, 166, (2003), pp. 44-50.
Roger M. Sullivan, "Erosion studies of infrared dome materials", Proceedings of SPIE, vol. 6545 (2007), pp. 65450G-1 thru 65450G-11.
M.A. George, "Fundamentals of feedback control for reactive sputtering", 2004 Society of Vacuum Coaters, 47$^{th}$ Annual Technical Conference Proceedings (2004).
M.A. George, "Versatile reactive sputtering batch drum coating with auxiliary plasma", 2004 Society of Vacuum Coaters, 47$^{th}$ Annual Technical Conference Proceedings (2004).
2004 Society of Vacuum Coaters, 47$^{th}$ Annual Technical Conference Proceedings, Plasma Proceedings, Apr. 24-29, 2004, pp. 405-490.
Chiharu Takahashi et al, "An electron cyclotron resonance plasma deposition technique employing magnetron mode sputtering," Journal of Vacuum Science and Technology: Part A, AVS, Jul. 1, 1988, pp. 2348-2352, vol. 6, No. 4.

* cited by examiner

*Primary Examiner* — Jason M Berman
(74) *Attorney, Agent, or Firm* — John J. Piskorski

(57) ABSTRACT

Optical articles of zinc sulfide and zinc selenide with thick coatings of alumina are disclosed. The alumina coatings are deposited on the zinc sulfide and zinc selenide by a microwave assisted magnetron sputtering. In addition to alumina coatings, the optical articles may also include various polymer coatings.

8 Claims, No Drawings

METHOD OF MAKING DURABLE ARTICLES

This application claims the benefit of priority under 35 U.S.C. §119(e) to U.S. Provisional Application No. 61/276,983, filed Sep. 18, 2009, the entire contents of which application are incorporated herein by reference.

The present invention is directed to a method of making durable articles of zinc sulfide and zinc selenide. More specifically, the present invention is directed to a method of making durable articles of zinc sulfide and zinc selenide having thick coatings of alumina.

Infrared materials such as zinc sulfide and zinc selenide are highly desirable materials for infrared (IR) articles, such as windows and domes for high speed aeronautical vehicles which may reach transonic speeds, due to their high transmission in the visible to long wavelength infrared (LWIR) band region, i.e., 0.6 µm to 14 µm. In general, transmissions through zinc sulfide and zinc selenide may be from around 60% and greater. However, zinc sulfide and zinc selenide are also relatively soft which makes them unsuitable for high speed aeronautical vehicles. Such articles must withstand rain and sand impact, as well as provide high transmission in the required wavelength bands. However, zinc sulfide and zinc selenide typically suffer considerable damage under rain and sand impact which results in loss of transmission and substantial increase in scatter. Scatter is a general physical process where radiation, such as light or moving particles, are forced to deviate from a straight trajectory by one or more localized non-uniformities in the medium through which they pass. In general, rain erosion tests are conducted in an artificial rain field of 2 mm nominal drop diameter falling at a rain rate of around 25.4 mm/hr and impacting samples at a velocity of around 210 m/sec. for an exposure time of around 20 minutes. A typical test is the Whirling Arm Rain Rig test performed by the University of Dayton Research Institute at the Wright Patterson Air Force Base, Dayton, Ohio. Tests performed on zinc sulfide and zinc selenide have indicated that these materials suffered considerable damage when exposed to the above rain field for 5 minutes or longer.

To improve durability of zinc sulfide and zinc selenide, coatings of hard and durable materials, such as diamond like carbon, alumina, boron nitride, gallium and phosphide are applied on infrared windows of zinc sulfide or zinc selenide. The choice of coating material depends upon the particular transmission band of interest. For mid-wave region, i.e., 3 µm to 5 µm, a preferred coating material is transparent alumina because it is relatively hard and durable and has high resistance to rain and sand erosion. In addition, its refractive index is smaller than that of zinc sulfide and zinc selenide which can yield higher transmissions than uncoated zinc sulfide and zinc selenide. Also the thermal expansion coefficient of alumina is close to that of zinc sulfide and zinc selenide. This permits alumina deposition over a wide substrate temperature range without causing excessive compressive and tensile stresses at the coating interface for alumina thickness ranges of 20 µm and less.

Several conventional deposition processes have been used to produce alumina coatings having thicknesses of 20 µm and less on zinc sulfide and zinc selenide substrates. Examples of conventional processes are physical vapor deposition, such as ion-assisted electron beam evaporation process and sputtering, and chemical vapor deposition processes (CVD). However, such processes have not been successful in depositing alumina having a thickness of greater than 20 µm which can withstand exposure to rain and sand while maintaining the desired transmissions. In addition, alumina coatings having thicknesses exceeding 20 µm have been found to be unreliable. Adhesion was poor and coating thickness was non-uniform. This was due to what is believed to be the build-up of excessive stresses at the interface of the alumina coating and the zinc sulfide or zinc selenide substrate. Another problem is the size of the article to be coated. The larger the article the more difficult it is to apply an alumina coating which both has a uniformly thick coating and reliably adheres to the substrate. Process parameters used to deposit alumina coatings, such as thin coatings of 20 µm or less may not necessarily be extrapolated to provide acceptable parameters for depositing thicker coatings on the same size substrate. Parameters used to deposit coatings on relatively small substrates, i.e., diameters of around 10 µm and lesser, may not necessarily be extrapolated to provide parameters to deposit coatings of the same thickness on larger substrates. In addition to size, shape of the article may present difficulties, such as unconventional angles on the surface of the article. A number of physical properties of the materials are involved when coating thicknesses are increased or when the size of the article on which the coating is deposited is changed. Typically stresses, such as tensile and compressive stress, are involved which are unpredictable in their effects as the coating thickness is changed as well as the size of the article is changed.

The ion-assisted electron beam evaporation process as disclosed in WO 97/13169 and the article of R. M. Sullivan, A. Phelps, J. A. Kirsch, E. A. Welsh and D. C. Harris, *Erosion Studies of Infrared Dome Materials*, Proc. SPIE, Vol. 6545, 1-11 (2007) uses an electron beam to evaporate an aluminum or alumina target. The zinc sulfide substrate to be coated with alumina is mounted in a fixture and rotated around two axes, i.e., planatary rotation and spinning, to obtain a uniform coating deposition. An argon ion beam impinges on the substrate to provide energy during coating deposition. This process is quite slow with a deposition rate of less than 0.5 microns/hour and takes a number of weeks to apply thick coatings in tens of microns thickness range. In addition, production of windows with a coating thickness greater than 20 µm is expensive and difficult to achieve by this process due to excessive coating stress leading to coating delamination. Zinc sulfide coated with 30 µm of alumina coating applied using the ion assisted electron beam evaporation process were tested for rain erosion in a whirling arm rain rig. The coating peeled off after a few minutes of exposure and did not survive the full 20 min. of rain exposure. See R. M. Sullivan et al. Another issue with this method is difficulty encountered in applying alumina coatings on large zinc sulfide domes, i.e., diameter >15 cm, in conventional coating chambers. Because these domes have steep curvatures, the coatings adhere well to a central small area, i.e., diameter <10 cm, but delaminate on an outer part due to a steep angle of deposition, i.e. greater than 45 degrees. Moreover, as the thickness of the coatings exceed 20 µm it is believed that compressive and tensile stresses build up at the interface of the alumina coating and the zinc sulfide substrate resulting in delamination of the coating.

Sputtering is another physical vapor deposition process that has been used to deposit alumina coatings onto zinc sulfide. The sputtering process provides higher energy than the evaporation process and provides coatings which are denser and adhere better to zinc sulfide surfaces than the evaporation coatings. However, the coatings typically have a brownish tinge due to large scattering in the material which provides lower transmission of typically below 50%. The coating deposition rate is also low, i.e. less than 0.5 microns/hour, requiring prolonged deposition times to achieve a thickness of greater than 20 µm. Also there is a high potential for delamination for such deposit thicknesses. This is again believed to be due to compressive and tensile stresses at the interface of the coating and the zinc sulfide substrate.

Chemical vapor deposition or CVD is another process that is used to deposit alumina coatings at temperature ranges of 400-1000° C. Since zinc sulfide starts to sublime at a temperature of around 550° C., CVD processes requiring deposition at temperatures <550° C. are required. Workers in the art have tried thermal CVD processes in which aluminum acetyl acetonate was reacted with oxygen and water vapors to yield alumina coatings. However, these efforts did not yield high quality alumina coatings on zinc sulfide. The deposited coatings were relatively thin, i.e., <10 μm thick, non-uniform and did not yield high values of infrared transmission, i.e., less than 60%.

Although there are methods known to deposit alumina coatings on zinc sulfide and zinc selenide substrates, there is still a need for methods to deposit thick alumina coatings of greater than 20 μm on zinc sulfide and zinc selenide articles which can survive the full duration of rain and sand erosion and transmit in the required wavelength bands and are durable for use in high speed aeronautical vehicles.

In one aspect a method includes providing an article including zinc sulfide or zinc selenide; and depositing a layer of alumina greater than 20 μm thick on the zinc sulfide or zinc selenide at a deposition rate of 60 Å/minute or greater by microwave assisted magnetron sputtering.

In another aspect a method includes providing an article including zinc sulfide or zinc selenide; depositing alternating layers of at least one layer of a composition comprising one or more monomers and at least one layer of alumina greater than 20 μm thick on the zinc sulfide or zinc selenide; and curing the composition.

In a further aspect an article of zinc sulfide or zinc selenide includes a layer of alumina having a thickness of 20 μm or greater, the layer of alumina is deposited on the zinc sulfide or zinc selenide by a microwave assisted magnetron sputtering process at a rate of 60 Å/minute or greater.

In yet another aspect an article of zinc sulfide or zinc selenide includes alternating layers of at least one layer of a cured composition and at least one layer of alumina having a thickness of 20 μm or greater on zinc sulfide or zinc selenide, the layer of alumina is deposited on the zinc sulfide or zinc selenide by a microwave assisted magnetron sputtering process at a rate of 60 Å/minute or greater.

The magnetron sputtering step assisted by microwave plasma step provides a method of high deposition rates, large deposition areas and low substrate heating. Large area capability is important because this permits coating of large parts or can coat many small parts in the same run which reduces manufacturing cost per parts. Low substrate temperatures are desired to reduce stress due to thermal expansion mismatch between coating and substrate. The method is such that these two steps are performed substantially simultaneously to provide stoichiometric alumina coatings with transmission in the visible wavelength range and infrared wavelength range of 0.35 μm to 8 μm. The method also permits optimizing each step separately to provide thick alumina layers with the desired optical properties. Compositions including one or more monomers may be coated on the zinc sulfide and zinc selenide to provide further protection to the underlying zinc sulfide or zinc selenide from rain damage. The alumina and the alumina and cured composition coated zinc sulfide and zinc selenide articles may be used as windows and domes to protect sensitive electronic components in high speed aeronautical vehicles, windows in scanners, watches and optical applications, such as durable lenses, and in other articles wherever infrared materials are desired.

The microwave assisted magnetron sputtering method enables the formation of thick layers of alumina 20 μm or greater which adhere to zinc sulfide and zinc selenide articles at coating interfaces. The method also provides a denser alumina coating on the zinc sulfide and zinc selenide than many conventional processes. The microwave assisted magnetron sputtering method enables deposition of alumina on zinc sulfide and zinc selenide articles over a wide substrate temperature range without causing excessive stresses at the interfaces. The 20 μm and greater thick alumina coated zinc sulfide and zinc selenide articles are durable such that they may withstand rain and sand impact and provide high transmission in the desired wavelength ranges.

As used throughout this specification, the following abbreviations have the following meaning, unless the context indicates otherwise: ° C.=degrees Celsius; UV=ultraviolet; IR=infrared; MWIR=medium wavelength infrared; LWIR=long wavelength infrared; gm=gram; L=liter; mL=milliliter; m=meter; cm=centimeter; mm=millimeter; μm=microns; nm=nanometers; cc=cubic centimeters; min.=minutes; sec.=seconds; hr=hour; Torr=1 mm Hg=133.322368 pascals; sccm=standard cubic centimeters per minute; eV=electron volt; kW=kilowatt; kHz=kilohertz; GHz=gigahertz; psi=pounds/in$^2$=0.06805 atm (atmospheres); 1 atm=1.01325×10$^6$ dynes/cm$^2$; DC=direct current; and AC=alternating current.

The term "monomer" means a molecule which may combine with one or more other molecules to form a polymer. The term "stoichiometric" means that the elements of a chemical reaction combine in definite ratios and the amount of each element of the reactants is the same as each element in the product.

Unless otherwise noted, all percentages are by weight and are based on dry weight (solvent free weight). All numerical ranges are inclusive and combinable in any order, except where it is logical that such numerical ranges are constrained to add up to 100%.

Alumina is stoichiometrically deposited at a rate of 60 Å/min. and greater by microwave assisted magnetron sputtering onto and adjacent a surface of zinc sulfide or zinc selenide to form an alumina coating of greater than 20 μm. A surface of a zinc sulfide or zinc selenide substrate is treated for coating by grinding, lapping and polishing it to a scratch/dig ratio of 120/80 or better. Conventional methods may be used. Typically, grinding is done with abrasive particles, such as diamond, boron carbide, boron nitride, carbon nitride, silicon carbide, silicon nitride or mixtures thereof. Particle sizes may range from 0.005 μm to 30 μm. When diamond paste is used, the particle sizes may range from 2 μm or less. Such abrasive particles may comprise from 1 wt% to 30 wt% of aqueous slurries. Diamond wheels also may be used. Lapping and polishing may be done using conventional apparatus, such as with lapping plates and polishing pads. When lapping plates are used, the plates may turn at surface speeds of 300 m/min. to 3000 m/min. Lapping and polishing may be done at pressures of 1 psi to 15 psi for 1 hr to 10 hrs. Abrasives used in lapping and polishing are the same as used in grinding. The substrate is then cleaned with organic cleaners such as acetone and methyl alcohol cleaning solvents well known in the art.

The substrate is then mounted in a reactive sputtering drum coater, typically having a diameter of 1.2 m, with the treated surface facing into the interior of the sputtering drum coater or coating chamber. An example of one type of sputtering drum coater which may be used is a MicroDyn™ reactive sputtering drum coater (available from Deposition Sciences Inc., Santa Rosa, Calif.). The chamber is in the shape of an octagon with a 1.27 m maximum diameter. Each face of the octagon supports a process zone. The process zone is equipped with one of the following of hardware: DC magnetron, AC magnetron pair, microwave plasma applicator or heater. Mid-frequency pulsed DC power supplies power to the DC magnetrons. Mid-frequency AC power supplies power to the AC magnetrons. The AC magnetrons may minimize loss at the anode which is caused by migration of material from anode to cathode and typically provides a higher quality coating, e.g., less nodular growth. These nodules may occur on the surface of the coating. Nodular growth usually is a function of the coating thickness and increase as the coating thickness increases. The method reduces such nodular growth in contrast to conventional coating processes.

Two or more sputtering sources and two or more microwave plasma sources may be used simultaneously to increase alumina deposition rate. Typically two sputtering sources and two microwave plasma sources are used simultaneously. In the magnetron sputtering aspect of the method an aluminum electrode is used as the target. The aluminum electrode provides the source of aluminum for the alumina coating and typically is substantially pure aluminum, i.e., 99% to 99.99% pure. The target distance from the zinc sulfide or zinc selenide substrate may range from 8 cm to 20 cm, typically from 10 cm to 15 cm, more typically 11 cm to 13 cm. The target size may vary. The method permits wide deposition areas of 130,000 $cm^2$ and greater, i.e. 5 or more parts each 50 cm squares, with uniform thickness deposits. Typically, it is from 250 mm to 450 mm long by 100 mm to 150 mm wide. In the microwave plasma aspect microwave driven plasmas dissociate diatomic molecules of oxygen. Dissociation energies range from 1 eV to 20 eV, or such as from 2 eV to 10 eV, or such as from 4 eV to 8 eV and support bond formation between the aluminum and oxygen of the alumina deposit. Energy imparted to the monoatomic species created by the dissociation is transferred to the growing thin film of alumina. The drum upon which the substrate is mounted is rotated at the rate of 0.75 to 3 revolutions per second depending upon the coating deposition rate. Minor experimentation may be required to determine the appropriate rotation rate with the corresponding deposition rate. Typically, the rotation rate is from 1 to 2 revolutions per second. The method is such that these two steps are performed substantially simultaneously to provide stoichiometric alumina coatings.

The coating chamber is pumped down to a pressure of $10^{-5}$ Torr to $10^{-6}$ Torr prior to deposition using turbomolecular pump backed by a rotary pump. Diatomic oxygen and an inert gas, such as argon, neon or krypton, are introduced into the coating chamber. Typically argon is the inert gas of choice. Flow rates of diatomic oxygen range from 20 sccm to 80 sccm, typically from 40 sccm to 60 sccm. The flow rate of the inert gas is 30 sccm to 150 sccm, typically from 50 sccm to 100 sccm. Total pressure in the chamber is in the range of $2\times10^{-3}$ Torr to $7\times10^{-3}$ Torr, typically from $3\times10^{-3}$ Torr to $5\times10^{-3}$ Torr. Diatomic oxygen partial pressure is in a range of $1\times10^{-4}$ Torr to $20\times10^{-4}$ Torr, typically from $5\times10^{-4}$ Torr to $10\times10^{-4}$ Torr. The microwave source ionizes the mixture of the inert gas and diatomic oxygen to create plasma near the microwave source. The microwave plasma size may range from 300 mm to 400 mm long and about 5 cm to 15 cm wide (based upon electron density in the plasma). The microwave power ranges from 1 kW to 5 kW, typically from 2 kW to 4 kW. Frequency may range from 1 GHz to 5 GHz, typically from 2 GHz to 3 GHz.

Before coating, the zinc sulfide or zinc selenide substrate is pre-cleaned by exposing them to the microwave plasma. This pre-clean step removes organic residues, reduces water contamination and prepares the surface for film deposition. The pre-clean process lasts for 3 minutes to 7 minutes, typically from 4 minutes to 6 minutes. After pre-cleaning the DC or AC magnetrons are energized to start the deposition process. The DC or AC pulsed power ranges from 3 kW to 9 kW, typically from 5 kW to 7 kW. Frequency may range from 20 kHz to 50 kHz, typically 35 kHz to 45 kHz. During deposition the microwave plasma is kept on to stabilize the target aluminum plasma and to increase coating oxygen consumption. The zinc sulfide or zinc selenide substrate is maintained at temperatures of 40° C. to 200° C., or such as from 60° C. to 180° C. The coating deposition rate for alumina which produces minimal stress ranges from 60 Å/min. to 270 Å/min., typically from 190 Å/min. to 230 Å/min. Such deposition rates ensure minimal compressive and tensile stresses are produced in the alumina coating and that coating does not delaminate from the substrate.

Alumina coatings having thickness ranges of greater than 20 µm or such as from 30 µm to 60 µm may be deposited on zinc sulfide and zinc selenide substrates using the DC magnetron sputtering process. Typically, such coating thickness ranges may be achieved over a period of 20 hrs to 50 hrs with the DC magnetron process. Alumina coatings having thickness ranges of greater than 20 µm or such as from 30 µm to 100 µm may be deposited on zinc sulfide and zinc selenide substrates using the AC magnetron sputtering process. Alumina coatings applied with both AC and DC processes are uniform and adhesion at the interface of the alumina coating and the zinc sulfide or zinc selenide substrate is of a high integrity such that the alumina coating does not readily peel from the zinc sulfide or zinc selenide substrate. Deposition times range from 20 hours to 90 hours. Typically from 35 hours to 75 hours depending on the desired thickness.

Surface roughness of alumina coatings increases as the coating thickness increases. The surface roughness may undesirably scatter radiation that impinges on the substrate surface and may compromise performance of the alumna coated substrate. For example forward scatter of uncoated zinc sulfide of thickness 6 mm is 3%. The AC magnetron deposited alumina coating increases the forward scatter at 632.8 µm of zinc sulfide by 1%, i.e., from 3% to 4%, for 30 µm, 6% for 60 µm and 13% for 100 µm thick coatings. In order to reduce this scatter, the coated surface of zinc sulfide and zinc selenide is typically lapped and polished. Conventional lapping and polishing methods as described above may be used. Lapping and polishing may result in removing 10 µm to 20 µm of alumina from the coated substrate, thus reducing undesirable scatter. For example forward scatter of the polished alumina coated zinc sulfide at 632.8 µm may be reduced to 3% which is equal to the forward scatter of the uncoated zinc sulfide.

The alumina coatings have transmissions in the visible wavelength range of 400 nm to 700 nm and infrared wavelength range of 0.7 µm to 8 µm. Typically, transmission is in wavebands at 1.06 µm and 3-5 µm is required for many applications, such as trimode seeker domes, dual aperture IR windows and IR optical components, such as lenses, beamsplitters and prisms for lasers and various commercial and defense applications. Transmission of such wavelengths may range from 60% and greater, typically from 65% to 90%, more typically from 70% to 80%.

In another embodiment curable compositions including one or more monomers may be coated onto and adjacent the zinc sulfide or zinc selenide substrate followed by depositing the alumina coating onto and adjacent the cured composition coating. Alternatively, the curable composition may be deposited onto and adjacent the alumina coating which is on and adjacent the zinc sulfide and zinc selenide substrate. Additionally, the zinc sulfide and zinc selenide substrates may have a plurality of alternating layers of alumina and cured coatings. The cured coatings are flexible and further protect the underlying zinc sulfide or zinc selenide substrate from impact damage. In the first design, transmitted shock waves due to impact may become weakened by propagation through the thick alumina coating and reflected back by the flexible cured coating without causing significant damage in the zinc sulfide or zinc selenide substrate. In the second design, the cured coating weakens the shock waves due to impact which is then reflected from the thick alumina coating without causing significant damage to the zinc sulfide or zinc selenide substrate. The curable compositions may be applied by polymer coating methods known in the art. Examples of such methods are spin coating hot melt extrusion and dip coating. The cured coatings may range in thickness of up to 10 μm, typically from 5 μm to 10 μm. The cured coatings adhere well to the alumina substrate and have the desired impact and abrasion resistance for rain and sand. The cured coating also have a low modulus of elasticity as defined by $\lambda$=stress/strain, where $\lambda$ is elastic modulus. Elastic modulus is the tendency of permanent deformation. The coatings have uniform shrinkage during curing and have greater than 60% transmission at 1.06 μm and 3-5 μm.

Monomers which may be included in the curable compositions may have one or more reactive or cross-linking sites. A weight average molecular weight of the monomers may range from 10 to 10,000 and greater. Typically the weight average molecular weight is from 20 to 1000. Monomers may be included in amounts from 30 wt % to 95 wt % of the composition, or such as from 40% to 90% by weight of the composition. The compositions may be water based, organic solvent based or 100% solids. When the curable compositions are organic solvent based, conventional organic solvents typical for such compositions may be used. Typically, at least one acrylate functional monomer is included in the curable composition. In general, there are three major classes of acrylates: epoxy, polyester and polyurethane. Epoxy acrylates may be amine functionalized.

Epoxies include, but are not limited to, epoxy compounds such as bisphenol A-based materials and cycloaliphatic epoxides, vinyl ethers such as divinyl ethers, and aliphatic urethane divinyl ethers.

Diisocyanates which may be included in the curable compositions include, but are not limited to, aromatic diisocyanates, such as, 2,4-tolyllenediisocyanate, 2,6-tolylenediisocyante and mixtures thereof, crude tolylenediisocyanate, 4,4'-diphenylmethanediisocyanate, 2,4-diphenylmethanediisocyanate, polymethylenepolyphenyl polyisocyanate and 1,5-naphthylenediisocyanate; aliphatic or alicyclic diisocyanates, such as, hexamethylene-diisocyante, lysinediisocyanate, isophoronediisocyanate, 4,4'-dicyclohexylmethane-diisocyanate, isopropylidene bis (cyclohexylisocyanate), and xylidenediisocyanate; and dimmers, trimers, and carbodiimide modified compounds thereof. Among the diisocyanates the aliphatic and alicyclic diisocyanates are typically used because of their weathering resistance.

Mono-functional acrylates include, but are not limited to, isobornyl acrylate, isobornyl methacrylate, cyclic trimethylolpropane formal acrylate, tetrahydrofurfuryl acrylate, isodecyl acrylate, tridecyl acrylate, 2-phenoxyethyl acrylate, 4-t-butylcylcohexyl acrylate, octyl and decyl acrylate.

Multifunctional acrylates include, but are not limited to, diacrylates such as propoxylated neopentyl glycol diacrylate, hexanediol diacrylate, tripropylene glycol diacrylate, dipropylene glycol diacrylate and 1,3-butylene glycol diacrylate, alkoxylated hexanediol diacrylate, tripropylene glycol diacrylate, neopentyl glycol diacrylate, ethoxylated bisphenol A diacrylate, ethoxylated bisphenol A dimethacrylate, and triacrylates and higher include, but are not limited to, amine modified polyether acrylates, trimethylolpropane triacrylate, tris(2-hydroxy ethyl) isocayanuarate triacryalte, dipentaerythritol penta and hexa-acrylate, ethoxylated pentaerythritol tetraacrylate The curable compositions may be cured by any suitable method known in the art such as by electron beam, UV light, visible light, and by free radical initiators. Typically the compositions are cured by UV light.

Typically, the compositions include one or more photoinitiators. Such photoinitiators include, but are not limited to, cationic photoinitiators such as sulfonium salts and iodonium salts, free radical photoinititators such as arylketones, diarylketones and arylphoshine oxide-containing photoinitiators. Such photoinitiators are well known in the art and are readily commercially available, or may be made by methods described in the literature. Examples of commercially available arylketones include DAROCUR™ 184, IRGACURE™ 1173, ESACURE™ ONE and ESACURE™ TZT; and examples of commercially available arylphosphine oxide-containing photoinitiators include IRGACURE™ 500, 819 and 1850. Typically, they are used in amounts of 0.01 wt % to 10 wt %.

Optionally, the curable compositions may include nanoparticles of one or more metal oxides, such as alumina, MgO, spinel ($MgAl_2O_4$), $HfO_2$, zirconia, yittria, cerium oxide and other oxides which transmit in the visible and MWIR wave length region. Other materials include, but are not limited to, BN, $Si_3N_4$, SiC, MgF, GaP, diamond and mixtures thereof. These may be mixed with one or more of the metal oxides. When the nanoparticles of alumina are included in the curable compositions, they are included in amounts of at least 1 wt %, typically 10 wt % to 30 wt %. The amount of the nanoparticles of alumina may vary and may be increased in a curable composition by choosing appropriate monomer components. Minor experimentation may be used to determine the types of monomers to increase particle concentration. When the curable coating composition includes acrylate monomers, the acrylate monomers are typically included in the uncured solution in amounts of 90 wt % to 95 wt % of the solution excluding the weight of the nanoparticles with the remainder of the solution containing photoinitiators or other curing agents. The nanoparticles range in average size from 5 nm to 500 nm, or such as from 10 nm to 150 nm, or such as from 10 nm to 75 nm. The nanoparticles may be commercially available, or prepared by methods known in the literature.

This invention can be used to produce durable windows and domes for use in the visible to MWIR, i.e., 0.35 μm to 5 μm, wavelength region in high speed aeronautical vehicles. These windows also may be useful for extended IR range applications covering the 5μ to 8 μm region. The alumina coated substrates may also be used as windows in grocery scanners and watches. Other applications include, but are not limited to, production of a variety of optical components such as durable lenses and beam splitters.

The following examples are intended to further illustrate the invention, but are not intended to limit its scope.

EXAMPLE 1

Multiple samples of CLEARTRAN™ zinc sulfide, obtainable from Dow Electronic Materials, Marlborough, Mass., each 2.5 cm in diameter and 6 mm thick are prepared by grinding, lapping and polishing them to scratch/dig of 80/50 using alumina particles having particle diameters in the range of 9-0.3 μm. The samples are first cleaned with acetone and then with 70 wt % methyl alcohol and then mounted in a reactive sputtering drum coater of a MicroDyn™ reactive sputtering drum coater. Two sputtering sources and two microwave plasma sources are used simultaneously to deposit alumina on the zinc sulfide samples at a deposition rate of 200 Å/minute. The target material is 99.99% pure aluminum, and it is at a distance of 12 cm from the samples. The drum upon which the samples are mounted is rotated at the rate of 1 revolution per second. The coating chamber is pumped down to a pressure of $10^{-6}$ Torr prior to deposition. A mixture of diatomic oxygen and argon are introduced into the deposition chamber. The flow rate of diatomic oxygen and argon, respectively are 50 sccm and 100 sccm. Total pressure in the chamber is 0.004 Torr. Microwave power is 3 kW with a frequency of 2.54 GHz. Microwaves create plasma near the microwave source.

Before coating, the samples are pre-cleaned by exposing them to the microwave plasma for 5 min. The DC magnetrons are then energized to start the deposition process. The DC pulsed power range is 6 kW and the frequency is 40 kHz. During deposition, microwave plasma is retained to stabilize the target plasmas and to increase coating oxygen consumption. The alumina coating deposition is performed for 25 hrs.

The alumina coating on each sample is 30 μm thick and adheres to the samples. The average transmission in the 3 μm to 5 μm range is around 70% when measured with a calibrated Fourier transform infrared spectrometer (FTIR).

EXAMPLE 2

Two 30 μm thick alumina coated samples #s A5 and A6 having an average transmission in the 3 μm to 5 μm range are tested for 5 and 10 min. of rain exposure at 90°. Rain exposure testing is conducted using a Whirling Arm Rain Rig. In the Whirling Arm system, the samples are placed at each end of the two ends of a propeller blade and rotated to achieve high sample velocities. As the whirling arm rotates, the artificial field of water drops falls from hypodermic needles from the top. The rain test conditions are an artificial rain field of 2 mm nominal drop diameter falling at a rain rate of 25.4 mm/hr and impacting the samples at normal incidence, i.e. an impact angle of 90 degrees or rain impact perpendicular to the surface, at a velocity of 210 m/s for exposure time of 5 to 10 min. After the rain impact, the samples are again measured for IR transmission and the average transmission in 3 μm to 5 μm range is around 69% for sample A5 and for sample A6 as shown in Table 1. This shows minor loss during rain exposure of 5 and 10 min. of only 1%.

After the rain impact samples A5 and A6 are measured for transmission at 1.06 μm with a spectrophotometer and the transmissions are around 70%. Forward scatter of these samples is measured with a scatterometer using a He—Ne laser at 0.6328 μm and the forward scatters are around 5%. The values are close to typical values which are obtained for alumina coated samples before rain impact.

Two 30 μm thick alumina coated sample #s A2 and A1 are tested for small and large sand impact. The small sand impact is from dry silica sand or dust with a particle size in the range of 38 μm to 53 μm and with a speed of 270 m/s at normal incidence (90 degrees). The small particles impact the surface with a total mass loading of 12 mg/cm². The average 3 μm to 5 μm transmission of sample A2 is around 70% before impact and around 68% after sand impact providing a minor loss of 2%. The large sand impact is from dry silica sand with a particle size of 125 to 177 μm with a speed of 135 m/s at normal incidence. The large particles impact the surface with a total mass loading of 30 mg/cm². The average 3 to 5 μm transmission of sample A1 is around 70% before impact and around 50% after sand impact providing a minor loss of 20% as shown in Table 1.

TABLE 1

| Sample # | Coating Thickness (μm) | Property (transmission) | Rain/Sand Impact | Value before Impact (%) | Value after Impact (%) |
|---|---|---|---|---|---|
| A5 | 30 | 3-5 μm | 5 min rain | 70 | 69 |
| A6 | 30 | 3-5 μm | 10 min rain | 70 | 69 |
| A2 | 30 | 3-5 μm | Small sand | 70 | 68 |
| A1 | 30 | 3-5 μm | Large sand | 70 | 50 |

EXAMPLE 3

Same as example 1 except that the deposition is inspected at 25 hours and the coating does not peel or have large stress to bend the samples. After inspection, the coating process is restarted as before and then continues for an additional 12.5 hours for a total deposition time of 37.5 hours to produce a coating of 45 μm thick. The alumina coating is expected to adhere well to the sample. The transmission of the coated zinc sulfide window in the 3 μm to 5 μm range is around 68% with FTIR.

Two 45 μm thick alumina coated sample #s A10 and A11 are tested for 20 minutes of rain exposure under the same conditions as given in Example 2. After the rain impact, the samples are measured for IR transmission and the average transmission in 3 μm to 5 μm range is around 67% for sample A10 and around 68% for sample A11 as shown in Table 2. A minor loss due to rain exposure of 1% occurs for sample A10. A11 has no loss.

After the rain impact, the samples A10 and A11 are also measured for transmission at 1.06 μm with a spectrophotometer and the results are around 65% and around 68%, respectively. The forward scatter at 0.6328 μm of these samples is around 9% and 5%, respectively. All these values are close to typical values for alumina coated samples before rain impact.

Two 45 μm thick alumina coated sample #s A9 and A8 are tested for small and large sand impact under the same conditions as given in Example 1. For small particle impact, the average 3 μm to 5 μm transmission of sample A9 is around 68% before impact and around 66% after sand impact providing a minor loss of 2%. For large particle impact the average 3 μm to 5 μm transmission of sample A8 is around 68% before impact and around 55% after sand impact providing a loss of 13%. This loss is smaller than observed for coating thickness of 30 μm in Example 2 and indicates that thicker alumina coatings may provide good resistance to large particle damage.

TABLE 2

| Sample # | Coating Thickness (μm) | Property | Rain/Sand Impact | Value before Impact (%) | Value after Impact (%) |
|---|---|---|---|---|---|
| A10 | 45 | 3-5 μm Trans | 20 min rain | 68 | 67 |
| A11 | 45 | 3-5 μm Trans | 20 min rain | 68 | 68 |

TABLE 2-continued

| Sample # | Coating Thickness (μm) | Property | Rain/Sand Impact | Value before Impact (%) | Value after Impact (%) |
|---|---|---|---|---|---|
| A9 | 45 | 3-5 μm Trans | Small sand | 68 | 66 |
| A8 | 45 | 3-5 μm Trans | Large sand | 68 | 55 |

EXAMPLE 4

Same as example 1 except that the deposition is continued for 50 hours to produce coating of 60 μm thickness. On inspection the alumina coating adheres to the samples. The transmission of the coated zinc sulfide windows are measured in the 3 μm to 5 μm range and are around 64% using FTIR. Two 60 μm thick alumina coated sample #s A14 and A15 are tested for 10 and 20 minutes of rain erosion under the same conditions as given in Example 2. After the rain impact the samples are again measured for IR transmission and no significant degradation in the average transmission in the 3 μm to 5 μm range is observed for both samples. This shows that 60 μm coating provides excellent resistance to rain erosion.

After the rain impact the samples A14 and A15 are also measured for transmission at 1.06 μm with a spectrophotometer and the results are around 68% and 70%, respectively. Forward scatter at 0.6328 μm of the samples are around 8% and 6%, respectively. All the values are close to typical values for alumina coated samples before rain impact.

Two 60 μm thick alumina coated sample #s A13 and A12 are tested for small and large sand impact under the same conditions as given in Example 2. For small particle impact the average 3 μm to 5 μm transmission of sample A13 is around 64% before impact and around 63% after sand impact providing a minor loss of 1%. For large particle impact the average 3 μm to 5 μm transmission of sample A12 is around 64% before impact and around 60% after sand impact providing a loss of 4%. This loss is smaller than observed for coating thickness of 30 μm in Example 2 and 45 μm in Example 3 and indicates that alumina coating of thickness 60 μm or greater may provide good resistance to large particle damage.

TABLE 3

| Sample # | Coating Thickness (μm) | Property | Rain/Sand Impact | Value before Impact (%) | Value after Impact (%) |
|---|---|---|---|---|---|
| A14 | 60 | 3-5 μm Trans | 10 min rain | 64 | 64 |
| A15 | 60 | 3-5 μm Trans | 20 min rain | 64 | 64 |
| A13 | 60 | 3-5 μm Trans | Small sand | 64 | 63 |
| A12 | 60 | 3-5 μm Trans | Large sand | 64 | 60 |

EXAMPLE 5

One hundred micron thick alumina coating is produced by replacing the DC magnetron with AC magnetron in the reactive sputtering drum coater. The AC sputtering eliminates anode loss sometimes associated with DC sputtering and also produces less nodules on the coating surface. A total of 41 zinc sulfide samples each 2.5 cm in diameter by 6 mm thick are prepared by grinding, lapping and polishing them to scratch/dig of 80/50 as in Example 1. The samples are cleaned with a solution of acetone and methyl alcohol as in Example 1 and then mounted in the MicroDyn™ reactive sputtering drum coater. Two sputtering sources and two microwave plasma sources are used simultaneously to provide a deposition rate of 250 Å/min. The target distance from substrate is 12 cm. The target material is 99.99% pure aluminum. The drum upon which the substrate is mounted is rotated at a rate of 1 revolution per second. The coating chamber is pumped down to a pressure of $10^{-5}$ Torr prior to deposition. A mixture of diatomic oxygen and argon is introduced into the deposition chamber. The flow rate of oxygen and argon, respectively, is 40 sccm and 80 sccm. Total pressure in the chamber is 0.004 Torr. Microwave power is 3 kW with a frequency of 2.54 GHz. Before coating the samples are pre-cleaned by exposing them to the microwave plasma for 5 minutes. The AC magnetrons are then energized to start the deposition process. The AC pulsed power is 7 kW and frequency is 40 kHz. During deposition microwave plasma is retained to stabilize the target plasmas and to increase oxygen consumption in the coating.

The alumina coating deposition is performed for 25 hours and then the chamber is opened to inspect the samples. No sign of coating delamination or excessive stress is observed. Fourteen samples are pulled out of the chamber and are numbered D1 to D14. A cross-section sample of D14 is cut and polished. This cross-section is magnified with an optical microscope and inspected. The alumina coating appears very uniform and its thickness is measured to be 30 μm. The remaining 27 samples are processed with a lapping and polishing pad to remove and reduce the size of any nodules. The samples are processed again in the coating chamber for another 25 hours of deposition. This added another 30 μm of alumina coating on top of the previous 30 μm to make the coating thickness 60 μm. Again the coating chamber is opened and samples are inspected. Fourteen samples are pulled out of the chamber again and are numbered E1 to E14. A cross-section sample of E14 is cut, polished and inspected with an optical microscope under 200× magnification. The alumina coating appears uniform and its thickness is measured to be around 60 μm. The remaining 13 samples are processed with a lapping/polishing pad to remove/reduce size of the any nodules. These samples are processed again in the coating chamber for another 34 hours of deposition. This adds another 40 μm of alumina coating on top of the previous 60 μm to make the coating thickness 100 μm. No delamination is apparent in all 13 samples. These samples are numbered as F1 to F13. A cross-section sample of F13 is cut, polished and inspected with an optical microscope under 200× magnification. The alumina coating appears uniform and its thickness is measured to be around 100 μm. Samples D14, E14 and F13 are characterized for visible and IR transmission and forward scatter and the results are summarized in Table 4.

TABLE 4

| Zinc Sulfide Substrate Thickness (mm) | Coating Thickness (μm) | Property | Measured at (μm) | Value (%) |
|---|---|---|---|---|
| 6 | 30 | Transmission | 1.06 | 77 |
|  |  |  | 3-5 | 69 |
|  |  | Forward Scatter | 0.6328 | 0.2 |
| 6 | 60 | Transmission | 1.06 | 71 |
|  |  |  | 3-5 | 61 |
|  |  | Forward Scatter | 0.6328 | 4 |

TABLE 4-continued

| Zinc Sulfide Substrate Thickness (mm) | Coating Thickness (μm) | Property | Measured at (μm) | Value (%) |
|---|---|---|---|---|
| 6 | 100 | Transmission | 1.06 | 62 |
|  |  |  | 3-5 | 53 |
|  |  | Forward Scatter | 0.6328 | 7 |

The scatter values in Table 4 are given for alumina coating only. The forward scatter of the zinc sulfide samples of thickness 6 mm is 3%. The scatter due to alumina coating may be obtained by taking the difference of scatter values of zinc sulfide before and after alumina coating. For 30 μm thick alumina coating most scatter contribution is due to the zinc sulfide substrate. From Table 4 we see that window transmission decreases but forward scatter is increases as the alumina coating thickness increases from 30 μm to 100 μm. This may be due to an increase in surface roughness of the thicker coating.

In order to smooth out coating surface, the alumina coating is lapped and polished to reduce the coating thickness by 10 μm, 15 μm and 20 μm for 30 μm, 60 μm and 100 μm coating samples, respectively. The polished samples increase the sample transmission at 1.06 and 3-5 micron by up to around 5% and reduce the forward scatter of alumina coating at 632.8 nm to <1%.

Eight alumina coated zinc sulfide samples having a thickness of 6 mm of three different coating thicknesses 30 μm, 60 μm, 100 μm are tested for large and small sand impact. Large sand conditions are dry silica sand with a particle size range of 149 μm to 177 μm and mass loading of 30 mg/cm$^2$ impinges with a velocity of 240 m/s. Small sand conditions are dry silica sand with a particle size range of 38 μm to 44 μm and mass loading of 12 mg/cm$^2$ impinges with a velocity of 262 m/s. In both, large and small sand cases the sand impact time is 12 minutes and the impact angle is 90 degrees.

The large and small sand impact results are presented in Table 5. The thicker coatings are preferred to minimize damage due to large and small sand impact.

TABLE 5

| Coating Thickness (μm) | Property | Measured at (μm) | Large Sand Impact (%) | Small Sand Impact (%) |
|---|---|---|---|---|
| 30 | Transmission loss | 1.06 | 26 | 10 |
|  |  | 3-5 | 15 | 4 |
|  | Scatter increase | 0.6328 | 4 | 1 |
| 60 | Transmission loss | 1.06 | 14 | 8 |
|  |  | 3-5 | 9 | 5 |
|  | Scatter increase | 0.6328 | 0.5 | -0.2 |
| 100 | Transmission loss | 1.06 | 10 | 3 |
|  |  | 3-5 | 6 | 5 |
|  | Scatter increase | 0.6328 | -2 | -3 |

Three alumina coated zinc sulfide samples D3, E3 and F3, each having a thickness of 6 mm and having three different coating thicknesses 30 μm, 60 μm, 100 μm, respectively, are tested for rain impact at 90 degrees for 20 minutes using the Whirling Rain Ring process. The rain erosion tests are conducted in an artificial rain field of 2 mm nominal drop diameter falling at a rain rate of 25.4 mm/hr and impacting the samples at a velocity of 210 m/s. The rain impact results are presented in Table 6. In general as coating thickness increase the transmission loss at wavelengths of 1.06 and 3-5 μm increase and forward scatter at a wavelength of 632.8 nm decreases. The decrease in scatter for thicker coating follows a trend similar to large and small sand impact as reported above. The rain impact smoothes out the alumina coating surface and this effect produces a larger decrease in forward scatter as coating thickness increases.

TABLE 6

| Coating Thickness (μm) | Property | Measured at (μm) | Rain impact for 20 min at 90 degrees angle (%) |
|---|---|---|---|
| 30 | Transmission loss | 1.06 | 42 |
|  |  | 3-5 | 29 |
|  | Scatter increase | 0.6328 | 15 |
| 60 | Transmission loss | 1.06 | 3 |
|  |  | 3-5 | 11 |
|  | Scatter increase | 0.6328 | -1 |
| 100 | Transmission loss | 1.06 | 2 |
|  |  | 3-5 | 10 |
|  | Scatter increase | 0.6328 | -7 |

EXAMPLE 6

Eight zinc sulfide samples #s 23-30 are prepared by coating them with a thin layer of polymer and alumina particle coating. Two samples #s 31-32 are coated with a polymer but do not include alumina particles. The alumina particles range in diameter from 20 nm to 30 nm. Three different compositions #9, #11, #5 of the polymer and alumina particle coatings are prepared. The composition of these polymer and alumina particle coatings by weight are as follows: 1 solution #9 includes 1,3-butylene glycol diacrylate with 30% of an alumina suspension containing 47.5% alumina, aliphatic urethane acrylate 23.8%, tris(2-hydroxy ethyl) isocyanuarate triacrylate) 23.8%, ESACURE™ ONE 4% which is a dibenzoyl photoinitiator and ESACURE™ TZT 0.9% which is a mixture of trimethylbenzophenone and methylbenzophenone, 2 solution #11 includes 1,3-butylene glycol diacrylate with 30% alumina suspension containing 95% alumina, ESACURE™ ONE 4% and ESACURE™ TZT 1% and 3 solution #5 includes 1,3-butylene glycol diacrylate, aliphatic urethane acrylate 23.8%, tris(2-hydroxyl ethyl) isocyanurate triacrylate) 23.8%, ESACURE™ ONE 4% and ESACURE™ TZT 0.9%. These compositions are mixed thoroughly using an ultrasound bath at 50° C. and then used to spin coat one side of ten zinc sulfide samples, four each with solutions 9 and 11 and two with solution #5, with polymer coating. The spin coater is run at a rate of 1500 revolutions per minute for 1 minute. After the application of the coating, the samples are UV cured. The coating density is approximated by weight averaging the density of the components of the solutions. The densities are 1.1 g/cc, solution #9, 5, and 1.05 g/cc, solution #11. The calculated density in conjunction with the change-in-weight measurement is used to determine the coating thickness. The coating thickness range is 5.3 μm to 6.6 μm, #9, 2.6 μm to 3.3 μm, #11, and 9.1 μm to 9.8 μm, #5.

The ten coated zinc sulfide samples are tested for rain and sand erosion using the same conditions as in Example 5. The results are shown in Table 7. Of the two compositions containing alumina particles composition #9 provides minimum transmission loss at 3 μm to 5 μm due to rain and sand impact. After the rain impact, the polymer and alumina coated samples are examined and it is observed that any damage causing transmission loss occurs not on the surface but inside the substrate. This is discernible by a surface which is very shinny and reflective.

TABLE 7

| Sample # | Solution # | Coating Thickness (μm) | Transmission (3-5 μm) after coating (%) | Rain/Sand impact | Transmission loss (%) |
|---|---|---|---|---|---|
| 24 | 9 | 5.4 | 61 | Small Sand | 3 |
| 28 | 11 | 3.3 | 68 | Small Sand | 10 |
| 23 | 9 | 6.6 | 63 | Large Sand | 38 |
| 27 | 11 | 3 | 68 | Large Sand | 41 |
| 31 | 5 (No alumina) | 9.1 | 57 | 20 min rain | 0 |
| 32 | 5 (No alumina) | 9.8 | 59 | 20 min rain | 0 |
| 25 | 9 | 5.3 | 63 | 15 min rain | 2 |
| 26 | 9 | 5.3 | 63 | 15 min rain | 2 |
| 29 | 11 | 3 | 68 | 10 min rain | 7 |
| 30 | 11 | 2.6 | 67 | 10 min rain | 4 |

EXAMPLE 7

Thirty-two samples of zinc sulfide are provided. Sixteen are coated with polymer coating of suspension #9 and the other sixteen are coated with solution #5 as described in Example 6. These samples are coated with alumina of thickness >30 μm using DC and AC microwave assisted magnetron sputtering process as described in Examples 1-5. These samples are tested for rain and sand erosion using the same conditions as in Example 5. The results are expected to show a minor transmission loss at 1.06 and 3-5 micron due to rain and sand impact. After the rain impact, the coated samples are examined and no significant damage occurs in the polymer or alumina coating and the zinc sulfide substrate.

What is claimed is:

1. A method comprising:
    a) providing a substrate comprising zinc sulfide or zinc selenide on a sputtering drum in a sputtering drum coating chamber;
    b) providing a source of alumina, a source of diatomic oxygen and a source of inert gas in the sputtering drum coating chamber, wherein a target distance of the source of alumina to the zinc sulfide or the zinc selenide ranges from 8 cm to 20 cm;
    c) rotating the substrate comprising the zinc sulfide or the zinc selenide on the sputtering drum at 0.75 to 3 revolutions per second;
    d) introducing diatomic oxygen in the sputtering drum coating chamber at a flow rate of 20 sccm to 80 sccm and introducing inert gas in the sputtering drum coating chamber at a flow rate of 30 sccm to 150 sccm at a total sputtering drum coating chamber pressure of $2\times10^{-3}$ Torr to $7\times10^{-3}$ Torr;
    e) ionizing the diatomic oxygen and inert gas with microwaves at microwave powers of 1 kW to 5 kW and at a frequency of 1 GHz to 5 GHz; and
    f) depositing a layer of alumina 30 μm to 60 μm thick by pulsed DC magnetron sputtering or 30 μm to 100 μm thick by AC magnetron sputtering on the zinc sulfide or zinc selenide at a deposition rate of 60 Å/minute to 270 Å/minute at pulsed power ranges of 3 kW to 9 kW and frequency ranges of 20 kHz to 50 kHz, wherein the zinc sulfide or zinc selenide are maintained at temperatures of 40° C. to 200° C.

2. The method of claim 1, further comprising a step of depositing alternating layers of at least one layer of a composition comprising one or more monomers and at least one layer of the alumina on the zinc sulfide or zinc selenide; and curing the composition.

3. The method of claim 2, wherein the composition further comprises alumina particles.

4. The method of claim 2, wherein the one or more monomers is chosen from polyols, polyamines, diisocyanates and diisocyanate derivatives.

5. The method of claim 1, wherein the deposition rate is 190 Å/minute to 230 Å/minute.

6. The method of claim 1, wherein diatomic oxygen partial pressure ranges from $1\times10^{-4}$ Torr to $20\times10^{-4}$ Torr.

7. The method of claim 1, further comprising pre-cleaning the zinc sulfide or the zinc selenide with microwave plasma prior to deposition.

8. The method of claim 1, wherein the pulsed power ranges from 5 kW to 7 kW and frequency ranges from 35 kHz to 45 kHz.

* * * * *